United States Patent
Saenger et al.

(10) Patent No.: US 7,112,851 B2
(45) Date of Patent: Sep. 26, 2006

(54) FIELD EFFECT TRANSISTOR WITH ELECTROPLATED METAL GATE

(75) Inventors: Katherine L. Saenger, Ossining, NY (US); Cyril Cabral, Jr., Mahopac, NY (US); Hariklia Deligianni, Tenafly, NJ (US); Panayotis C. Andricacos, deceased, late of Croton-On-Hudson, NY (US); by Caliopi Andricacos, legal representative, Chicago, IL (US); Philippe M. Vereecken, Leuven (BE); Emanuel I. Cooper, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/228,269

(22) Filed: Oct. 26, 2005

(65) Prior Publication Data

US 2006/0081885 A1 Apr. 20, 2006

Related U.S. Application Data

(62) Division of application No. 10/694,793, filed on Oct. 29, 2003, now Pat. No. 6,967,131.

(51) Int. Cl.
*H01L 29/786* (2006.01)
(52) U.S. Cl. .................. 257/350; 257/E27.06
(58) Field of Classification Search ............. 257/350, 257/E27.06
See application file for complete search history.

(56) References Cited

U.S. PATENT DOCUMENTS

| 6,188,120 | B1 | 2/2001 | Andricacos et al. |
| 6,255,187 | B1 * | 7/2001 | Horii .................... 438/396 |
| 6,391,773 | B1 | 5/2002 | Andricacos et al. |
| 6,686,282 | B1 * | 2/2004 | Simpson et al. ........... 438/685 |
| 6,777,317 | B1 * | 8/2004 | Seibel et al. ................ 438/486 |
| 6,873,048 | B1 * | 3/2005 | Gao et al. ................... 257/750 |

OTHER PUBLICATIONS

Misra, et al., "Electrical properties of Ru-based alloy gate electrodes for dual metal gate Si—CMOS", *IEEE Electron Device Letters* 23 354 (2002).
Zhong, et al., "Properties of Ru—Ta alloys as Gate Electrodes for NMOS and PMOS Silicon Devices", *IDEM* 01 467 (2001).

* cited by examiner

*Primary Examiner*—Asok Kumar Sarkar
(74) *Attorney, Agent, or Firm*—Connolly Bove Lodge & Hutz

(57) ABSTRACT

Disclosed is a method for making a metal gate for a FET, wherein the metal gate comprises at least some material deposited by electroplating as well as an FET device comprising a metal gate that is at least partially plated. Further disclosed is a method for making a metal gate for a FET wherein the metal gate comprises at least some plated material and the method comprises the steps of: selecting a substrate having a top surface and a recessed region; conformally depositing a thin conductive seed layer on the substrate; and electroplating a filler gate metal on the seed layer to fill and overfill the recessed region.

20 Claims, 5 Drawing Sheets

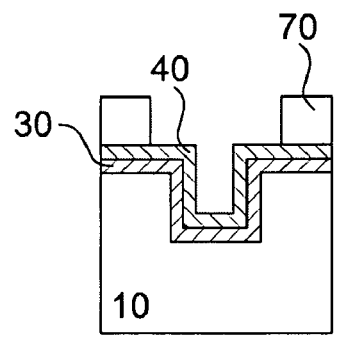
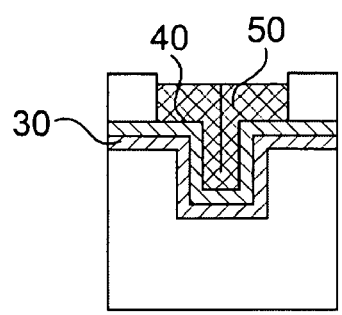
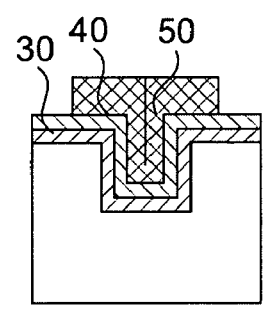
FIG. 2A     FIG. 2B     FIG. 2C
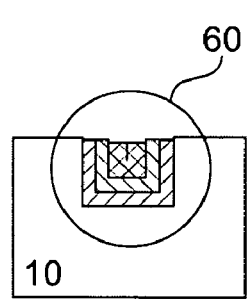
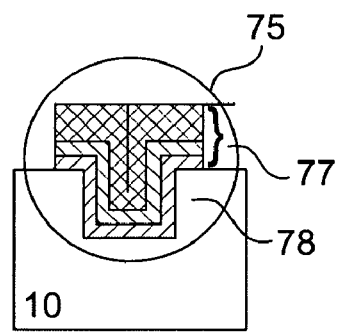
FIG. 2D     FIG. 2E

FIELD EFFECT TRANSISTOR WITH ELECTROPLATED METAL GATE

CROSS REFERENCE TO RELATED APPLICATION

The present application is a division of U.S. patent application Ser. No. 10/694,793 filed Oct. 29, 2003 now U.S. Pat No. 6,967,131.

FIELD OF THE INVENTION

This invention generally relates to field effect transistors (FETs) and complementary metal oxide semiconductor (CMOS) devices incorporating metal gates, wherein the metal gates comprise at least some material deposited by electroplating. This invention further relates to plating methods for fabricating metal gates in FET devices containing metal gate stacks that are at least partially plated.

BACKGROUND OF THE INVENTION

Advanced complementary metal oxide semiconductor (CMOS) devices may increasingly be utilizing metal gate materials instead of the more traditional doped polycrystalline silicon (poly-Si) in order to avoid "poly-Si depletion" and "boron penetration" effects. The selection of a particular metal for a gate material can be guided by a number of considerations, such as, for example, the work function and electrical resistivity desired, the type of gate dielectric with which the gate will be in contact (high-k or other), the thermal budget that the gate metal will be expected to survive, and the existence of a damage-free gate metal deposition process. Though mid-gap metals such as tungsten (W) might be acceptable for both n-type field effect transistors (n-FETs) and p-type field effect transistors (p-FETs) in certain types of CMOS, it is often desirable to use a (high work function) gate metal tailored for p-FETs and another (low work function) gate metal tailored for n-FETs in an approach known as "dual metal/dual work function" CMOS.

In general, metal gates for CMOS devises can comprise one or more layers of a pure metal or alloy, a metal or metal alloy silicide, or a metal-containing conductive oxide or nitride, where at least one of these layers is in contact with the device's gate dielectric. A bilayer metal gate might comprise, for example, a thin bottom "cladding" or "work function-setting" layer (in contact with an underlying gate dielectric) and a thicker upper "fill layer" to provide good conductivity. Ruthenium (Ru) is a gate metal under consideration for p-FETs, either alone, or as a thin cladding layer in combination with a thicker fill layer of W.

Fabrication schemes for metal gate CMOS often utilize a replacement gate process flow in which the gate metal material is made to fill a gap created by the removal of a "dummy gate" (formed earlier in the processing from a "sacrificial place holder" material). An advantage of the replacement gate process is that it allows the metal to be deposited after the dopant activation anneals (often the highest temperature processing steps). A disadvantage often associated with such a process is that most metal deposition techniques cannot fill gaps of the desired dimensions (e.g., lateral <0.1 µm, vertical >0.2 µm) without leaving voids or keyholes.

Existing approaches for gap filling replacement gate structures may have certain disadvantages. For example, in one approach, an in-situ doped poly-Si is deposited into the gap over a metallic cladding layer. The poly-Si is often good at gap filling, but its conductivity is relatively poor and its processing temperature is typically above what can be tolerated by the cladding layer.

In another approach, the gap (which may or may not contain a predeposited metallic cladding layer) is lined with a first layer of thin W formed by chemical vapor deposition (CVD) using a $W(CO)_6$ precursor. Gap filling is then attempted with a second layer of W deposited using a $WF_6$ precursor. Unfortunately, the W from the $WF_6$ precursor often does not fill the gap to the extent desired.

In methods for a "single metal dual/work function" CMOS, a single gate material is deposited over n-FET and p-FET device areas and then modified so that it has an n-FET-appropriate work function in n-FET device areas and a p-FET-appropriate work function in p-FET device areas. For example, Misra, et al., "Electrical properties of Ru-based alloy gate electrodes for dual metal gate Si-CMOS", *IEEE Electron Device Letters* 23 354 (2002), have deposited a ruthenium-tantalum (Ru—Ta) alloy with an n-FET work function over n-FET and p-FET device areas and then converted the Ru—Ta alloy into an Ru-rich Ru—Ta alloy with a p-FET work function (in the p-FET device areas) by deposition and annealing of additional Ru. See also, Zhong, et al., "Properties of Ru—Ta Alloys as Gate Electrodes for NMOS and PMOS Silicon Devices", *IDEM* 01 467 (2001). The fabrication of a patterned Ru layer for this additional Ru could be simplified if the Ru could be selectively deposited only in the p-FET device areas.

The approaches and methods described in detail below may overcome at least one of the shortcomings discussed above.

SUMMARY OF THE INVENTION

The present invention relates to a method for making a metal gate for a FET, wherein the metal gate comprises at least some material deposited by electroplating. In one embodiment, the present invention relates to a method for making a metal gate for a FET wherein the metal gate comprises at least some plated material and the method comprises the steps of: selecting a substrate having a top surface and a recessed region; conformally depositing a thin conductive seed layer on the substrate; and electroplating a filler gate metal on the seed layer to fill and overfill the recessed region. The present invention further relates to an FET device comprising a metal gate that is at least partially plated.

BRIEF DESCRIPTION OF THE DRAWINGS

These and other features of the present invention will become apparent upon consideration of the following detailed description of the invention when read in conjunction with the drawings, in which:

FIGS. 2A–2E show, in cross sectional view, a through-mask version of the plating process of FIGS. 1A–1E;

DETAILED DESCRIPTION OF THE INVENTION

The present invention provides a method of making an FET comprising a metal gate stack, wherein at least some components of the metal gate stack are deposited by electroplating.

In one embodiment, the present invention provides an FET device structure containing an at least partially plated metal gate. In this embodiment, the plated metal can be formed on a conductive seed layer.

In another embodiment, the present invention provides a method for making a metal gate for an FET. In this method, where a replacement gate process is utilized, the gate cavity to be filled is lined with a conductive seed layer and then filled and overfilled with at least one electroplated metal, where the plating may be blanket or through a block-out mask. After plating, excess metal above the top of the gate cavity can be removed by a process such as, for example, chemical mechanical polishing.

A "through-mask plating" version of the above process may also provide a relatively simple route to dual work function FET gates (a general description of through-mask plating is provided in U.S. Pat. Nos. 6,188,120 and 6,391,773, the entire disclosures of which are incorporated herein by reference). In one example of such a process, a blanket-deposited Ru—Ta alloy seed layer with an n-FET work function may be deposited over n-FET and p-FET device regions. This layer can then be selectively converted into a Ru-rich Ru—Ta alloy with a p-FET work function over the p-FET device regions by through-mask plating additional Ru and annealing.

At least one of the methods that are described in detail below may provide void free metal gates in replacement gate process flows. At least one of the methods described in detail below may also provide a metal gate stack for an FET, wherein at least some components of the metal gate stack are electroplated. In addition, at least one of these methods may provide a method for forming single metal/dual work function gates, wherein at least some components of at least one metal gate stack are electroplated. At least one of these methods may also reduce the complexity of dual metal/dual work function methods for CMOS metal gates.

Figure 1A:
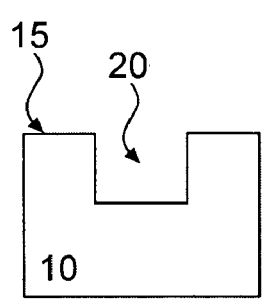
FIGS. 1A–1F show, in cross sectional view, the steps of an exemplary process for making an at least partially plated metal gate stack.
Figure 1B:
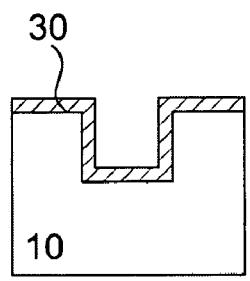

One method falling within the scope of the present invention involves making an at least partially plated metal gate stack, as shown in FIGS. 1A–1E. FIG. 1A shows a substrate 10 having a top surface 15 and a gate-shaped recessed region or cavity 20 extending below the top surface. Optional cladding or a work function-setting layer 30 is then deposited on the substrate 10. This optional cladding layer may be continuous (as shown in FIG. 1B), discontinuous (e.g., deposited on some or all horizontal surfaces but not vertical surfaces) or omitted altogether. Conductive seed layer 40 may then be added as shown, for example, in FIG. 1C (where such a layer is added to the structure shown in FIG. 1B), thereby forming a seed-layer lined gate cavity 45. The conductive seed layer may comprise one or more continuous conductive layers, the topmost of which can be a metal on which it is possible to electroplate.

Figure 1C:
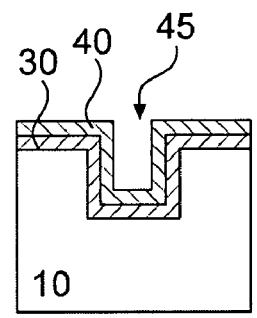
Figure 1D:
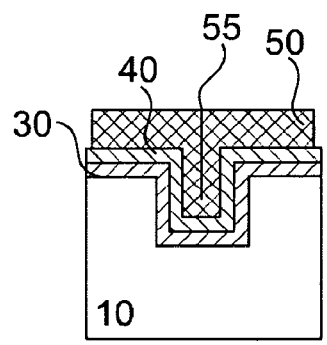

FIG. 1D shows the structure of FIG. 1C after the pre-plating gate cavity 45 has been filled and overfilled with electroplated metal 50 using a blanket electroplating process. The electroplated metal may or may not have a seam 55.

Figure 1E:
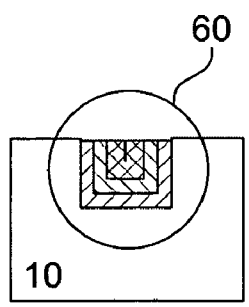
Figure 1F:
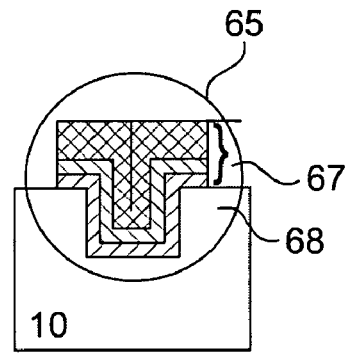

FIG. 1E shows the structure of FIG. 1D after the plated metal and cladding/seed layers on the top substrate surface 15 have been removed by a process such as chemical mechanical polishing to leave a planar structure containing a composite metal gate 60. The polishing process used to form the composite metal gate 60 of FIG. 1E may be replaced with a subtractive patterning step, such as, for example, etching through a mask, to form the T-shaped gate 65 of FIG. 1F having a T-bar 67 and T-foot 68.

The planarization process leading to the structure of FIG. 1E may be easier if the metal fill is selectively electroplated in a through-mask electroplating process, as shown in FIGS. 2A–2D. FIG. 2A shows the structure of FIG. 1C after the application of a patterned block-out mask 70 to regions that do not need to be plated. FIG. 2B shows the structure of FIG. 2A after the pre-plating cavity 45 has been filled and overfilled with electroplated metal 50 using a through-mask electroplating process. Resist 70 is removed from the structure of FIG. 2B to produce the structure of FIG. 2C, which is planarized to produce the structure shown in FIG. 2D.

Alternatively, patterned block-out mask 70 may be designed to facilitate the formation of a T-shaped gate, shown as 75 in FIG. 2E. The T-shaped gate 75 comprises a T-bar 77 and T-foot 78, where the lateral dimensions of the T-bar correspond to the openings in the mask 70. The structure of FIG. 2E is produced from the structure of FIG. 2C by removing exposed regions of the cladding/seed layers 30/40 by a process such as, for example, etching.

Other alternatives to the through-mask plating process of FIGS. 2A–2D may be possible if the conductive seed layer is formulated to have regions that are platable and regions that are not. For example, a seed layer may comprise a conductive bottom layer that is difficult to plate on (for example, W) and a top layer present only in selected areas that is easy to plate on (for example, Ru). By placing the easy-to-plate-on seed layer just in the gate cavity (or just on the bottom surface of the gate cavity) plating can be made to occur only in the cavity. This approach can greatly reduce the polish time and can, in addition, make more efficient use of the plated material.

It should be further noted that neither cladding layer 30 nor seed layer 40 need be continuous if the plated metal fill is formed by an electroless plating process. Ru, Pt, and Co are examples among many metals that may be plated electrolessly.

Figure 3A:
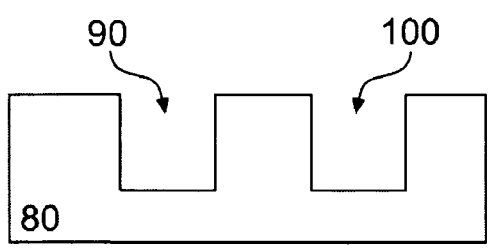
FIGS. 3A–3G show, in cross sectional view, a variation of the through-mask plating process of FIGS. 2A–2D that may be used for forming dual work function gates.
Figure 3B:
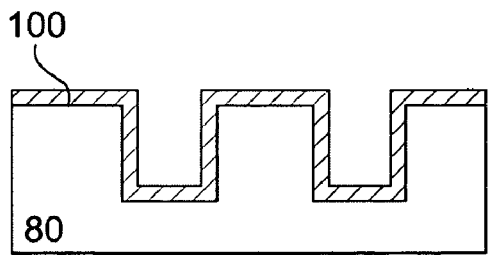
Figure 3C:
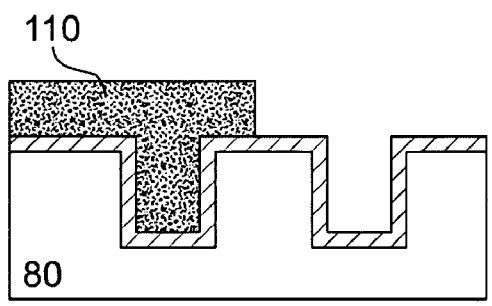
Figure 3D:
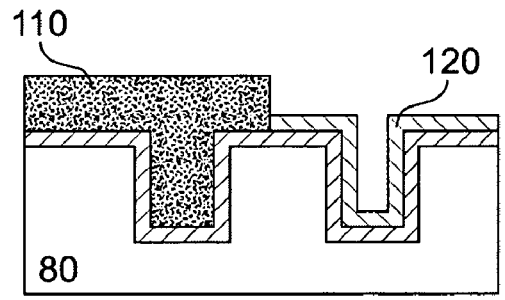
Figure 3E:
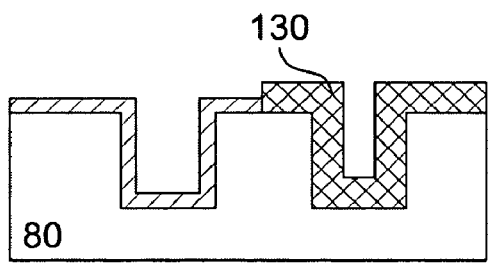
Figure 3F:
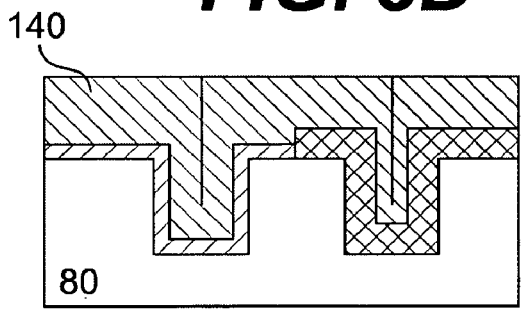
Figure 3G:
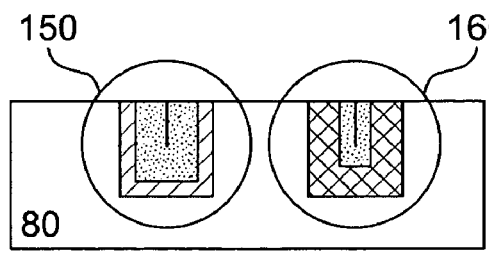

A variation of the through-mask plating process described above is potentially useful for forming dual work function gates with an n-FET gate of a Ru—Ta alloy and a p-FET gate of a Ru-rich Ru—Ta alloy. The process is shown in FIGS. 3A–3G. FIG. 3A shows substrate 80 with an n-FET gate cavity 90 and a p-FET gate cavity 100; FIG. 3B shows the structure of FIG. 3A after deposition of a blanket-deposited Ru—Ta alloy seed layer with an n-FET work function. The n-FET cavity region 90 is then masked off with resist 110, as shown in FIG. 3C, allowing a Ru layer 120 to be selectively plated in and around the p-FET gate cavity as shown in FIG. 3D. The resist is removed and the metals are annealed to produce the structure of FIG. 3E with Ru-rich Ru—Ta alloy 130. The structure is then optionally blanket electroplated with filler metal 140 to produce the structure of FIG. 3F. After planarization one is left with the structure of FIG. 3G with an n-FET gate 150 and a p-FET gate 160. This electrochemical method of selectively converting regions of a Ru—Ta alloy into a Ru-rich Ru—Ta alloy may be exercised on planar substrates as well as non-planar substrates 80 of FIGS. 3A–3G. For the case of planar substrates, the required patterning of the n-FET and p-FET gates may be performed after the plating.

Figure 5A:
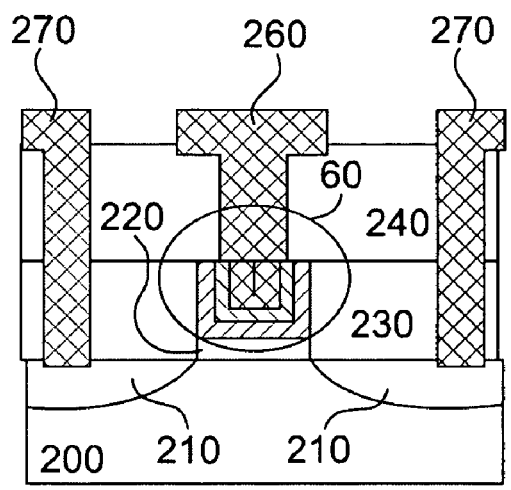
FIGS. 5A–5B show two FET device structures of the present invention.
Figure 5B:
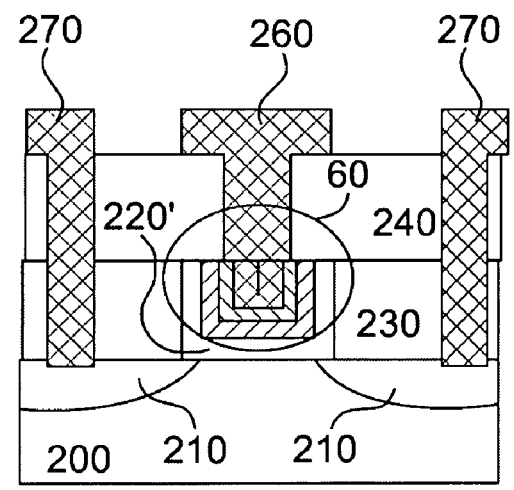

Another aspect of the present invention is an FET device structure comprising an at least a partially plated metal gate 60 such as that shown in FIGS. 5A–5B, with a substrate 200, source/drain regions 210, gate dielectric 220 or 220', dielectric layers 230 and 240, gate contact 260, and source/drain contacts 270. FIG. 5B shows an FET with a gate dielectric 220' lining the replacement gate cavity, and FIG. 5A shows an FET with a gate dielectric 220 just at the bottom of the replacement gate cavity. As shown in FIG. 1E, at least partially plated metal gate 60 of FIGS. 5A–5B may comprise a conductive seed layer 40, optional cladding or work function-setting layer 30, and plated metal 50 disposed on conductive seed layer 40.

Conductive seed layer 40 and optional cladding or work function-setting layer 30 may be one or more layers of a pure metal or metal alloy, a metal or metal alloy silicide, or a metal-containing conductive oxide or nitride, where at least one of these layers is in contact with the device's gate dielectric. The metal and metal alloying elements may be selected from, for example, Al, Co, Cr, Fe, In, Ir, Hf, Mg, Mo, Mn, Ni, Pd, Pt, Ir, La, Os, Nb, Rh, Re, Ru, Sn, Ta, Ti, V, W, Y, and Zr. These layers may also be doped with nonmetallic elements such as, for example, C, B, O, N, Si, Ge, P, As, and Sb. The metal and alloying elements may be deposited by any method known in the art such as, for example, chemical vapor deposition (CVD), metalorganic CVD (MOCVD), or sputtering.

The plated portion of the metal gate can be disposed on the conductive seed layer and may be one or more layers of a pure metal or metal alloy wherein the metal is selected from, for example, Al, Co, Cr, Fe, Ir, Hf, Mg, Mo, Mn, Ni, Pd, Pt, La, Os, Nb, Rh, Re, Ru, Sn, Ta, Ti, V, W, Y, and Zr. The plated portion of the metal gate may also be doped with nonmetallic alloying elements such as, for example, C, B, O, N, Si, Ge, P, As, and Sb. The gate stack metals may be optionally annealed at any time during or after gate stack fabrication. If desired, annealing conditions may be selected to alloy or intermix the plated portion of the gate with the conductive seed layer.

Examples of at least partially plated metal gate stacks of the invention include those with (i) a W or Mo cladding layer and plated Ir, Pt, Ru, or Rh fill, (ii) a noble metal cladding layer (such as Ir, Pd, Pt, Re, Rh, Ru) and plated Ir, Pt, Ru, or Rh fill, and (iii) those with a composite metal silicon nitride or metal nitride cladding layer and plated Ir, Pt, Ru, or Rh fill. Examples of metal nitrides and metal silicon nitrides include those of Ti, Ta, and W.

In the above embodiments, the gate-shaped recessed region or cavity is preferably less than 1 micron wide by 1 micron deep, preferably from about 20 nm to about 500 nm wide and from about 20 nm to about 300 nm deep, and more preferably from about 40 nm to about 100 nm wide and from about 70 nm to about 150 nm deep. The conductive seed layer is preferably from about 1 nm to about 30 nm thick, and more preferably from about 10 nm to about 20 nm thick. The conductive cladding layer is preferably about 0.05 nm to about 15 nm thick, and more preferably about 0.05 nm to about 2 nm thick It should be noted that the thicknesses of the conductive cladding and conductive seed layers may not be completely uniform, for example, the layer thickness on the sidewalls of the cavity might be thinner than the layer thickness at the bottom of the cavity, which may in turn be thinner than the layer thickness on the surfaces above the cavity.

Figure 4:
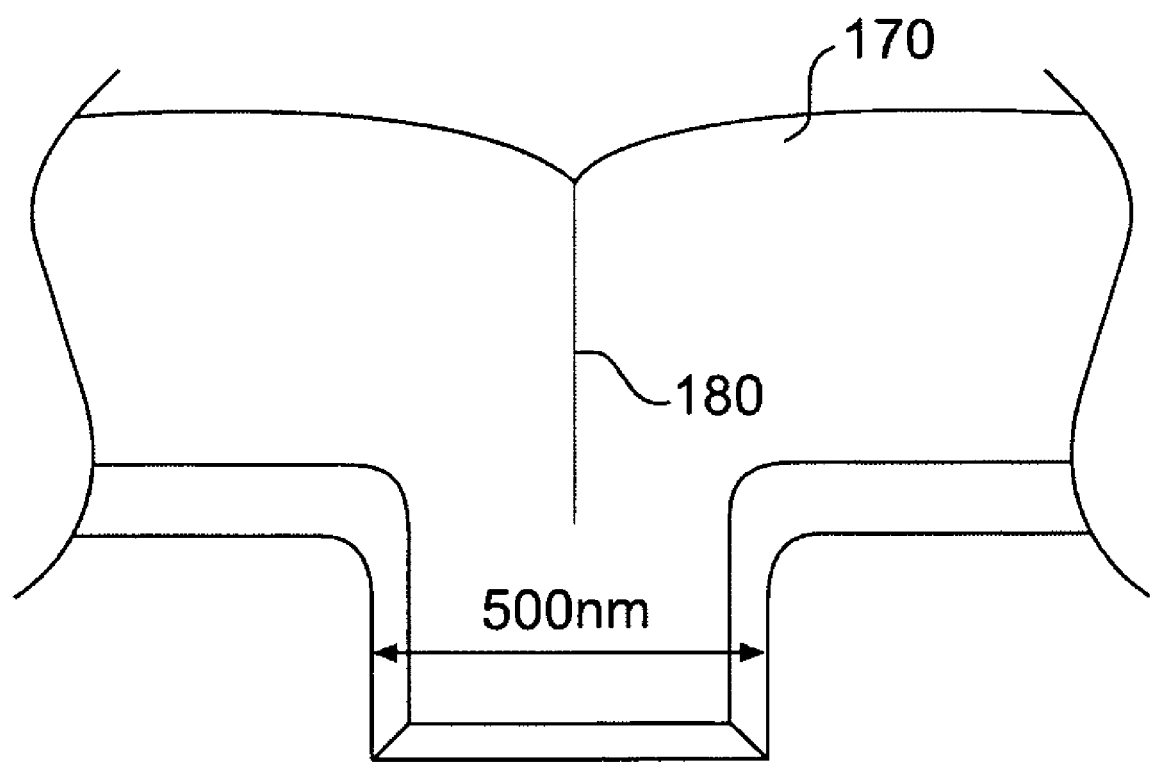
FIG. 4 shows a cross-section electron micrograph of an electroplated Ru gate structure at a stage of processing corresponding to the structure of FIG. 1D.

Essentially void-free electroplating has been demonstrated for Ru (FIG. 4). Such plating is also expected to be possible for Co, Ni, Pd, Pt, and Rh by applying the methods disclosed herein. Under certain plating conditions, it may also be possible to plate on seed layers of Re, W, or metal nitrides.

EXAMPLE

The present invention may be further illustrated by means of the following example:

Example 1

A trench-shaped cavity, approximately 500 nm wide and 500 nm deep, was first formed in a layer of $SiO_2$. The cavity was then lined with a sputter-deposited seed layer having the structure TaN(10 nm, bottom)/Ta(80 nm)/Ru(60 nm, top). Ru electroplating was performed in an Enthone OMI Ruthenex SP solution containing 4 g/li of $Ru^{+3}$. Wafers were rotated at 50 rpm in a bath held at 70° C.; current density was varied between 4 and 10 $mA/cm^2$. FIG. 4 shows a cross-section electron micrograph of an electroplated Ru gate structure at this stage of processing. Plated Ru layer 170 is void-free, though close inspection reveals the presence of 5 nm-wide seam 180.

While the present invention has been described in an illustrative manner, it should be understood that the terminology used is intended to be in a nature of words or description rather than of limitation. Furthermore, while the present invention has been described in terms of several illustrative embodiments, it is to be appreciated that those skilled in the art will readily apply these teachings to other possible variations of the inventions.

What is claimed as new and desired to protected by Letters Patent of the United States is:

1. A field effect transistor device comprising at least one recessed region extending to an underlying gate dielectric within a semiconductor substrate wherein the device further comprises a metal gate that is at least partially plated.

2. The field effect transistor device of claim 1, wherein the at least one recessed region within a semiconductor substrate is less than 1 micron wide and less than 1 micron deep.

3. The field effect transistor of claim 1, further comprising a conductive seed layer.

4. The field effect transistor device of claim 3, wherein the conductive seed layer comprises a metal, a metal alloy, a metal silicide, a metal alloy silicide, a metal-containing conductive oxide, or a metal-containing conductive nitride, wherein the metal is selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

5. The field effect transistor of claim 4, wherein the conductive seed layer is doped with at least one nonmetallic element selected from the group consisting of C, B, O, N, Si, Ge, P, As, and Sb.

6. The field effect transistor device of claim 3, wherein the conductive cladding layer comprises a metal, a metal alloy, a metal silicide, a metal alloy silicide, a metal-containing conductive oxide, or a metal-containing conductive nitride, wherein the metal is selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

7. The field effect transistor of claim 6, wherein the conductive cladding layer is doped with at least one nonmetallic element selected from the group consisting of C, B, O N, Si, Ge, P, As, and Sb.

8. The field effect transistor of claim 3, further comprising a conductive cladding layer.

9. The field effect transistor of claim 8, wherein the recessed region is from about 20 nm to about 500 nm wide and from about 20 nm to about 300 nm deep, the conductive seed layer is from about 1 mm to about 30 nm thick, and the conductive cladding layer is from about 0.05 nm to about 15 nm thick.

10. The field effect transistor of claim 8, wherein the conductive cladding layer comprises a metal or metal alloy, wherein the metal selected from the group consisting of W and Mo and the filler gate metal comprises a metal or metal alloy, wherein the metal is selected from the group consisting of Ir, Pt, Ru, and Rh.

11. The field effect transistor of claim 8, wherein the conductive cladding layer comprises a metal or metal alloy, wherein the metal is selected from the group consisting of Ir, Pd, Pt, Re, Rh, and Ru, and the filler gate metal comprises a metal or metal alloy, wherein the metal is selected from the group consisting of Ir, Pt, Ru, and Rh.

12. The field effect transistor of claim 8, wherein the conductive cladding layer comprises a metal, metal alloy, or metal nitride, wherein the metal is selected from the group consisting of Ti, Ta, and W, and the filler gate metal comprises a metal or metal alloy, wherein the metal is selected from the group consisting of Ir, Pt, Ru, and Rh.

13. The field effect transistor device of claim 1, wherein said metal gate comprises a conductor formed by alloying a plated metal with a metal underlayer.

14. The field effect transistor device of claim 13, wherein the plated metal comprises a metal or metal alloy, wherein the metal is selected from the group consisting of Al, Co, Cr, Fe, In, Ir, Hf, Mg, Mo, Mn, Ni, Pd, Pt, La, Os, Nb, Rh, Re, Ru, Sn, Ta, Ti, V, W, Y, and Zr.

15. The field effect transistor of claim 14, wherein the plated metal is doped with at least one nonmetallic element selected form the group consisting of C, B, O, N, Si, Ge, P, As, and Sb.

16. The field effect transistor of claim 1, wherein the filler gate metal comprises a metal or metal alloy, wherein the metal is Ru.

17. The field effect transistor of claim 16, wherein the conductive seed layer comprises a metal, metal alloy, or metal nitride, wherein the metal is selected from the group consisting of Ta and Ru.

18. A field effect transistor device comprising at least two recessed regions within a substrate wherein:
   at least one recessed region within a semiconductor substrate defines an n-FET gate cavity and at least one recessed region comprises a p-FET gate cavity;
   the at least one recessed region defining an n-FET gate cavity comprises a seed metal layer comprising Ru—Ta alloy;
   the at least one recessed region defining a p-FET gate cavity comprises a seed metal layer comprising a Ru-rich Ru—Ta alloy; and
   the device further comprises at least one metal gate that is at least partially plated.

19. The field effect transistor of claim 18, wherein said at least two recessed regions are less than 1 micron wide and less than 1 micron deep.

20. A field effect transistor device made by a process comprising:
   selecting a substrate having a top surface and at least two recessed regions within a semiconductor substrate extending to an underlying gate dielectric below said top surface, said recessed regions defining the position and dimensions desired for at least one n-FET gate and at least one p-FET gate;
   blanket depositing a seed metal layer comprising an Ru-Ta alloy on said substrate; masking off the at least one n-FET gate with resist;
   selectively plating a metal layer comprising Ru on the at least one p-FET gate; removing the resist over the at least one n-FET gate;
   annealing the metal layers deposited over the at least one p-FET gate to form an alloy layer with a p-FET work function;
   electroplating a filler gate metal on said seed layer and said alloy layer to fill and overfill said recessed regions; and
   removing at least a portion of said seed layer and overlaying filler gate metal to expose at least a portion of said top surface of said substrate.

* * * * *